United States Patent [19]

Takasaki

[11] Patent Number: 5,019,529
[45] Date of Patent: May 28, 1991

[54] HETEROEPITAXIAL GROWTH METHOD

[75] Inventor: Kanetake Takasaki, Tokyo, Japan

[73] Assignee: Fujitsu Limited, Kawasaki, Japan

[21] Appl. No.: 346,455

[22] Filed: May 2, 1989

[30] Foreign Application Priority Data

May 17, 1988 [JP] Japan ............... 63-118224

[51] Int. Cl.$^5$ ........................... H01L 21/20
[52] U.S. Cl. ................ 437/132; 148/DIG. 25;
148/DIG. 72; 148/DIG. 97; 148/DIG. 154;
156/613; 437/81; 437/108; 437/126; 437/973;
437/976
[58] Field of Search ........... 148/DIG. 3, DIG. 25,
148/56, 65, DIG. 72, DIG. 97, 110, 122, DIG.
54, 160, 169; 156/610-614; 427/248.1, 252,
255.1; 437/81, 82, 101, 105, 107, 108, 109, 110,
111, 112, 126, 132, 247, 939, 946, 973, 976

[56] References Cited

U.S. PATENT DOCUMENTS

| 4,561,916 | 12/1985 | Akiyama et al. | 156/612 |
| 4,632,712 | 12/1986 | Fan et al. | 437/132 |
| 4,699,688 | 10/1987 | Shastry | 156/610 |
| 4,707,216 | 11/1987 | Morkoc et al. | 156/610 |
| 4,757,030 | 7/1988 | Galvin et al. | 437/132 |

FOREIGN PATENT DOCUMENTS

| 0159252 | 10/1985 | European Pat. Off. | |
| 0193298 | 9/1986 | European Pat. Off. | |
| 0189621 | 8/1986 | Japan | 437/132 |
| 0088317 | 4/1987 | Japan | 437/132 |
| 0291914 | 12/1987 | Japan | 437/132 |
| 0133616 | 6/1988 | Japan | 437/132 |
| 0010618 | 1/1989 | Japan | 437/132 |

OTHER PUBLICATIONS

Lee et al., "Epitaxy of GaAs on Si: MBE and OMCVD", Mat. Res. Soc. Symp., vol. 91, 1987, pp. 33-44.

Akiyama et al., "Growth of GaAs on Si by MOCVD", J. Crys. Growth, 68 (1984), pp. 21-26.

Chand et al., ". . . Molecular Beam Epitaxially Grown GaAs on Si (100) by Rapid Thermal Annealing", Appl. Phys. Lett., 49(13), Sep. 29, 1986, pp. 815-817.

Lee et al., ". . . Molecular-Beam Epitaxy Grown GaAs-on-Si", J. Vac. Sci. Technol., B5(3), May/Jun. 1987, pp. 827-830.

Applied Physics Letters, vol. 50, No. 1, Jan. 5, 1987, pp. 31-33, American Institute of Physics, New York, N.Y., U.S., J. W. Lee et al.: "Defect Reduction by Thermal Annealing of GaAs Layers Grown by Molecular Beam Epitaxy on Si Substrates".

Applied Physics Letters, vol. 48, No. 22, Jun. 2, 1986, pp. 1516-1518, American Institute of Physics, New York, N.Y., U.S.; A. Christou et al.: "Formation of (100) GaAs on (100) Silicon by Laser Recrystallization".

Advances in Materials, Processing and Devices in III-V Compound Semiconductors, Nov. 28-Dec. 2, 1988, vol. 44, Boston, Mass., "Formation of High Quality GaAs/Si Hetro-Structure by Solid Phase Epitaxy", Miyao et al., pp. 273-284.

Primary Examiner—Olik Chaudhuri
Assistant Examiner—William Bunch
Attorney, Agent, or Firm—Staas & Halsey

[57] ABSTRACT

A heteroepitaxial growth method wherein a III-V group compound semiconductor is formed on a silicon substrate. A first amorphous III-V group compound semiconductor layer is formed on the silicon substrate before forming a III-V group compound semiconductor crystal layer on the amorphous III-V group compound semiconductor layer. A second amorphous III-V group semiconductor layer having a thickness greater than the crystal layer is formed on the III-V group compound semiconductor crystal layer and subjected to a solid phase epitaxial growth whereby the second amorphous III-V group compound semiconductor layer is made a single crystalline layer.

8 Claims, 3 Drawing Sheets

HETEROEPITAXIAL GROWTH METHOD

BACKGROUND OF THE INVENTION

1. Field of the Invention

The present invention relates to a heteroepitaxial growth method, and more particularly, to a method of growing a III-V group compound semiconductor crystalline thin film of, for example, GaAs and the like, on a silicon substrate.

2. Description of the Related Art

The heteroepitaxial growth of a III-V group compound semiconductor crystalline thin film of, for example, GaAs and the like, on a silicon (Si) substrate is conventionally carried out by a Metalorganic Chemical Vapor Deposition (MOCVD) process or a Molecular Beam Epitaxy (MBE) process.

The crystal lattice constants of Si and GaAs are 5.43 Å and 5.65 Å, respectively, and the thermal expansion coefficients thereof are $2.6 \times 10^{-6}/°C$. and $5.9 \times 10^{-6}/°C$., respectively.

Accordingly, since the crystal lattice constants and the thermal expansion coefficients of Si and GaAs are different, and particularly, since the thermal expansion coefficients of Si and GaAs are very different, when a GaAs layer is formed on a Si substrate by the MOCVD process, the GaAs is formed thereon in a polycrystalline state. Therefore, after an amorphous GaAs is grown on a Si substrate to a thickness of 100 to 200 Å at a temperature of about 450° C. to form an amorphous GaAs layer, crystalline GaAs is grown to a thickness of 3 to 5 μm at a temperature of 700 to 750° C., whereby a GaAs single crystalline thin film is obtained by a two-step process in which the mismatching of the lattice constant of Si and GaAs is relaxed by the occurrence of defects at the interface between the Si and GaAs.

Accordingly, even if GaAs is grown on a Si substrate by the above-mentioned two-step growth process, when the temperature of the substrate is changed to a room temperature after the growth of GaAs, significant warping of the substrate occurs and the GaAs surface becomes concave, as shown in Prior Art FIG. 1.

When GaAs is grown to a thickness of 3 μm or more, a tension stress stronger than $1 \times 10^9$ dyn/cm$^2$ or more is generated, and therefore, when the substrate is subjected to a heat treatment after the GaAs growth, lattice defects such as dislocation and the like are formed therein to generate cracks 10, and thus, in practice the formation of a GaAs layer on a Si substrate is not considered viable. In Prior Art FIG. 1, reference numerals 1, 2 and 3, denote a silicon (Si) substrate, an amorphous GaAs layer and a GaAs crystalline layer, respectively.

SUMMARY OF THE INVENTION

An object of the present invention is to provide an heteroepitaxial growth method wherein, when a III-V group compound semiconductor such as GaAs and the like is grown on a silicon substrate, stress at the heterointerface between the silicon substrate and GaAs layer is reduced and a wafer is obtained in which warping is greatly reduced.

According to the present invention, there is provided a heteroepitaxial growth method wherein a III-V group compound semiconductor is formed on a silicon substrate, comprising the steps of:

(a) forming a first amorphous III-V group compound semiconductor layer on the silicon substrate, (b) forming a III-V group compound semiconductor crystal layer on the amorphous III-V group compound semiconductor layer, (c) forming a second amorphous III-V group semiconductor layer to a desired thickness on the III-V group compound semiconductor crystal layer (3), and (d) subjecting the second amorphous III-V group compound semiconductor layer to a solid phase epitaxial growth method step, whereby the second amorphous III-V group compound semiconductor layer (4) is changed to a single crystalline layer.

According to the present invention, the step (a) is carried out at a first temperature, the step (b) is carried out at a second temperature higher than the first temperature, the step (c) is carried out at a third temperature lower than the second temperature and the step (d) is carried out at a fourth temperature between said second temperature and said third temperature.

The second amorphous group III-V compound semiconductor layer has a thickness larger than the group III-V compound semiconductor crystal layer.

DESCRIPTION OF THE PREFERRED EMBODIMENTS

The present invention will now be explained with reference to the drawings.

FIGS. 2A to 2D are cross-sectional views of one example of the present invention.

Figure 2A:
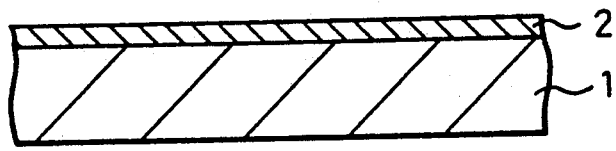
FIGS. 2A to 2D are cross-sectional views of an example according to the present invention.

As shown in FIG. 2A, a first amorphous GaAs layer 2 having a thickness of 100 to 200 Å is formed on a silicon substrate 1 having a diameter of 2 inches, at a temperature of 450° C., by a usual MOCVD process.

Figure 2B:
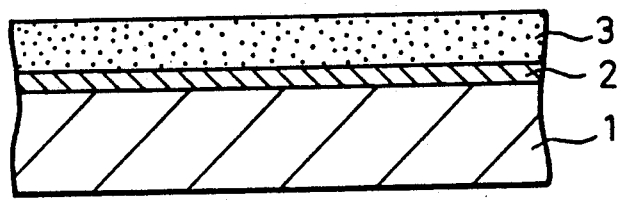

Then, as shown in FIG. 2B, a GaAs crystal layer 3 having a thickness of 1000 to 2000 Å is formed on the first amorphous GaAs layer 2, at a temperature of 700 to 750° C., using a usual MOCVD process.

Figure 2C:
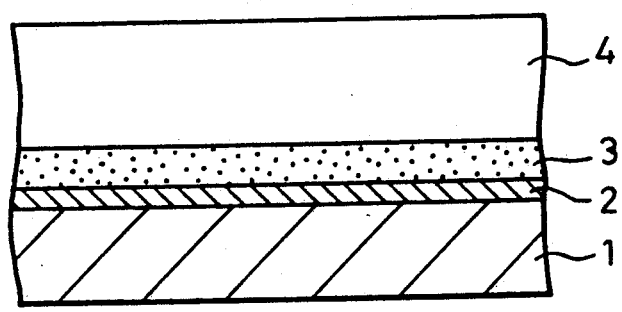
Figure 2D:
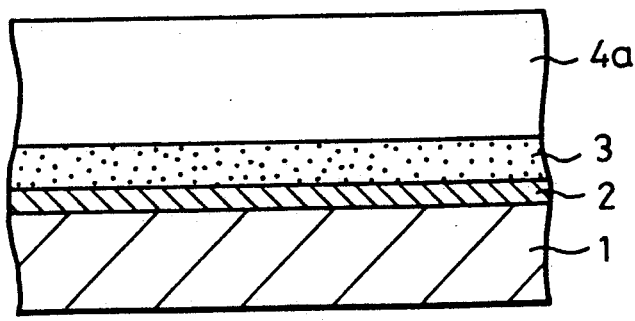

Then, as shown in FIG. 2C, a second amorphous GaAs layer having a thickness of about 3 to 5 μm is formed on the GaAs crystal layer 3, at a temperature of 400°~450° C.

The conditions for the above-mentioned MOCVD were as follows.

Namely, a trimethyl-gallium (TMG: (CH$_3$)$_3$Ga) etc. was used as a source gas of gallium (Ga), at a TMG supply rate of 15 cc/min. Further, arsine (AsH$_3$) was used as a source gas of arsenic (As), at a AsH$_3$ supply rate of 450 cc/min., and H$_2$ gas was used at a supply rate of 10 l/min., as a carrier gas of the source gases, TMG and AsH$_3$.

The above heat treatment was carried out by using a inductive heating method.

After forming the second amorphous GaAs layer 4, the obtained substrate was annealed at a temperature lower than the temperature of 700 to 750° C. at which the GaAs crystal layer 3 was formed, for example, at about 500 to about 650° C., using an atmosphere containing AsH$_3$ and supplied at a rate of 100 cc/min. and H$_2$ supplied at a rate of 1 l/min., whereby a solid phase epitaxial growth was carried out from the GaAs crystal layer 3 and the amorphous GaAs layer 4 gradually changed to a GaAs crystal layer 4a, from the lower portion thereof. Warping of the thus obtained GaAs crystal - Si substrate (wafer) was reduced from the conventional 60 μm to about 20 μm.

Figure 1:
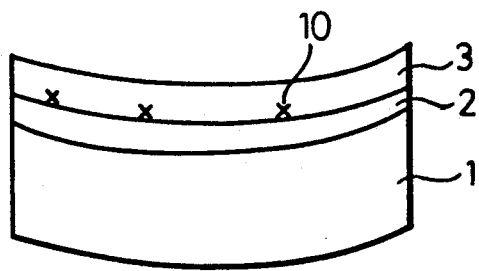
FIG. 1 is a cross-sectional view of an example of the prior art.
Figure 3:
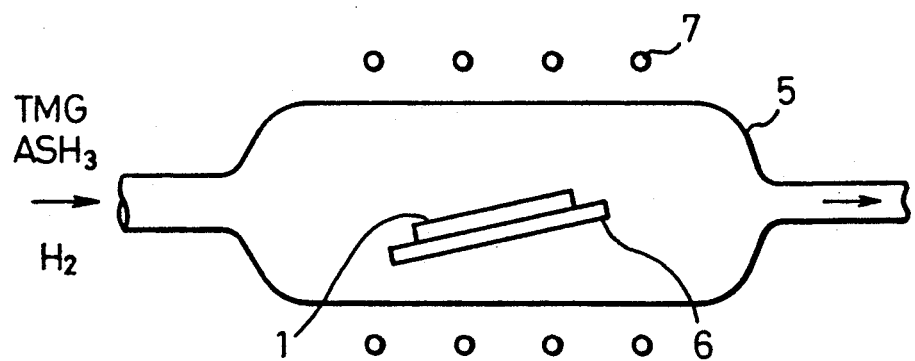
FIG. 3 is a schematic view of a reacting main portion of a MOCVD apparatus used in the present invention.

FIG. 3 is a schematic view of the reacting main portion of the MOCVD apparatus used in the Example of FIGS. 2A to 2D. As shown in FIG. 3, a silicon substrate (wafer) 1 is provided on a carbon susceptor 6 provided in an MOCVD reacting vessel 5 inductively heated using a heating coil 7. The reacting gases TMG and AsH$_3$ or the carrier gas H$_2$ is supplied into the vessel to form a GaAs layer (not shown).

Figure 4:
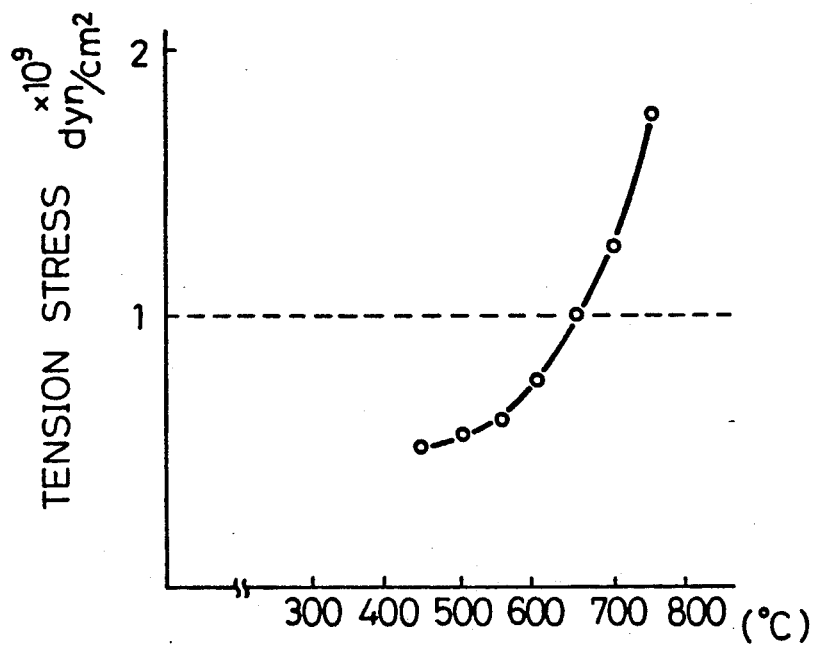
FIG. 4 is a graph showing the relationship between the tension stress and the solid phase epitaxial growth temperature; and, FIG. 5 is a graph showing the relationship between the epitaxial growth rate and the solid phase epitaxial growth temperature.

As explained above, although the solid phase epitaxial growth from the GaAs crystal layer 3 was carried out at a temperature of about 500 to about 650° C., the tension stress in GaAs layer obtained at a temperature below 650° C. was $1 \times 10^9$ dyn/cm$^2$ or less, as shown in FIG. 4.

Figure 5:
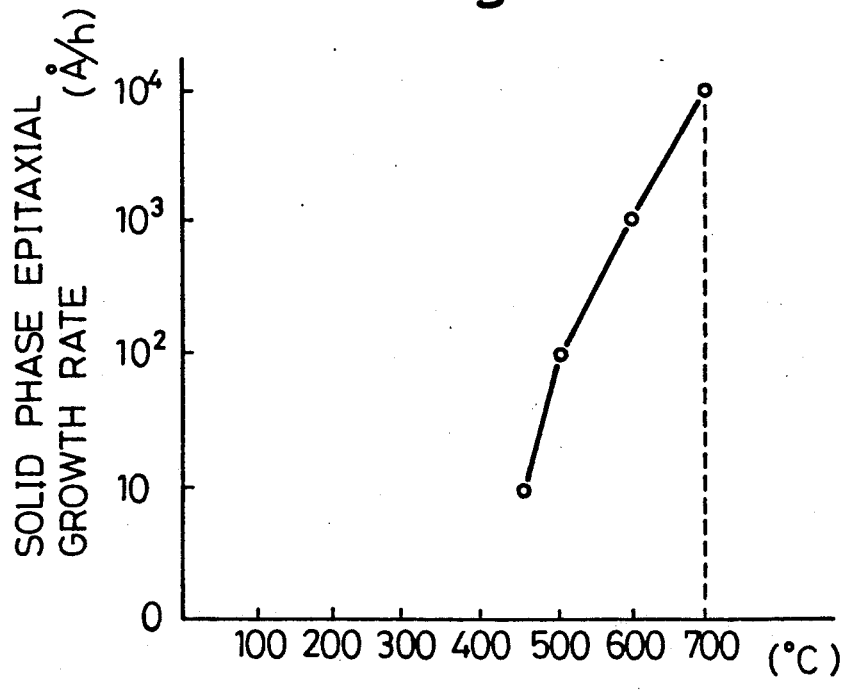

FIG. 5 shows the relationship between the solid phase epitaxial growth rate and the solid phase epitaxial growth temperature.

As can be seen in FIG. 5, the solid phase epitaxial growth rate is sharply decreased in the temperature range of 500° C. or less. Therefore, according to the present invention, the solid phase epitaxial growth temperature is defined as a temperature of from 500° to 650° C., as mentioned above.

Although an MOCVD process was used in the above-explained example, wherein GaAs is grown on a Si substrate, a well known MBE (Molecular Beam Epitaxy) process also can be used when, for example, forming an amorphous GaAs layer 2 on a Si substrate at a temperature of about 150° to about 400° C.

Further, according to the present invention, GaP, GaAs$_x$P$_{1-x}$, In$_x$Ga$_{1-x}$As, Ga$_{1-x}$As$_x$P$_{1-x}$ or InP also can be used as III-V group compound semiconductor.

As explained above, according to the present invention, the warping and the stress of the wafer obtained by a heteroepitaxial growth e.g., GaAs etc. growth on a Si substrate, are decreased with the result that, for example, the shift of the threshold voltage (Vth) etc. of FET elements or like elements which are fabricated on GaAs are prevented.

What is claimed is:

1. A heteroepitaxial growth method wherein a group III-V compound semiconductor is formed on a silicon substrate, said method comprising the steps of:
   (a) forming a first amorphous group III-V compound semiconductor layer on the silicon substrate,
   (b) forming a crystalline group III-V compound semiconductor layer on the first amorphous group III-V compound semiconductor layer,
   (c) forming a second amorphous group III-V compound semiconductor layer, having a thickness greater than the thickness of the crystalline group III-V compound semiconductor layer, on the crystalline group III-V compound semiconductor layer,
   (d) subjecting the second amorphous group III-V compound semiconductor layer to solid phase epitaxial growth method step at a temperature lower than that at which the crystalline group III-V compound semiconductor layer was formed in step (b), whereby the second amorphous group III-V compound semiconductor layer is changed to a single crystalline group III-V compound semiconductor layer, and
   (e) forming an element in said thus changed single crystalline group III-V semiconductor layer.

2. A heteroepitaxial growth method according to claim 1, wherein the first amorphous group III-V compound semiconductor layer, the crystalline group III-V compound semiconductor layer and the second amorphous group III-V compound semiconductor layer formed in steps (a) through (c) are selected from the group consisting of GaAs, GaP, GaAs$_x$P$_{1-x}$, In$_x$Ga$_{1-x}$As, In$_x$Ga$_{1-x}$As$_x$P$_{1-x}$, and InP.

3. A heteroepitaxial growth method according to claim 1, wherein said first amorphous group III-V compound semiconductor layer is formed in step (a) at a temperature of 400 to 450° C. and to a thickness of about 100 to 200 Å.

4. A heteroepitaxial growth method according to claim 1, wherein said second amorphous group III-V compound semiconductor layer is formed in step (c) at temperature of 400° to 450° C. and to a thickness of about 3 to 5 μm.

5. A heteroepitaxial growth method according to claim 1, wherein said temperature in step (d) ranges from about 500° C. to about 650° C.

6. A heteroepitaxial growth method according to claim 1, wherein said heteroepitaxial growth method is carried out by using a Metal Organic Chemical Vapor Deposition (MOCVD) process or a Molecular Beam Epitaxy (MBE) process.

7. A heteroepitaxial growth method according to claim 1, wherein said forming step (a) is carried out at a first temperature, said forming step (b) is carried out at a second temperature higher than the first temperature, said forming step (c) is carried out at a third temperature lower than the second temperature, and subjecting step (d) is carried out at a fourth temperature between said second temperature and said third temperature.

8. A heteroepitaxial growth method according to claim 2, wherein said first amorphous group III-V compound semiconductor layer is formed in step (a) at a temperature of 400° to 450° C. and to a thickness of about 100 to 200 Å.

* * * * *